(12) United States Patent
Renn

(10) Patent No.: US 8,653,584 B2
(45) Date of Patent: Feb. 18, 2014

(54) DUAL VERTICAL CHANNEL TRANSISTOR AND FABRICATION METHOD THEREOF

(75) Inventor: Shing-Hwa Renn, Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 646 days.

(21) Appl. No.: 12/727,265

(22) Filed: Mar. 19, 2010

(65) Prior Publication Data
US 2011/0227145 A1 Sep. 22, 2011

(51) Int. Cl.
*H01L 29/78* (2006.01)

(52) U.S. Cl.
USPC ........... 257/328; 257/288; 257/300; 257/334; 257/E29.262

(58) Field of Classification Search
USPC ............ 257/288, 328, E29.262, 300, 334
See application file for complete search history.

(56) References Cited

U.S. PATENT DOCUMENTS

2007/0190766 A1* 8/2007 Seo et al. ............ 438/585
2010/0052029 A1* 3/2010 Huang ............ 257/309

FOREIGN PATENT DOCUMENTS

TW 201010060 3/2010

* cited by examiner

*Primary Examiner* — Lynne Gurley
*Assistant Examiner* — Vernon P Webb
(74) *Attorney, Agent, or Firm* — Winston Hsu; Scott Margo

(57) ABSTRACT

A dual vertical channel transistor includes a tuning fork-shaped substrate body; a buried bit line embedded at a bottom of a recess between two prong portions of the tuning fork-shaped substrate body; an out-diffused drain region adjacent to the buried bit line in the tuning fork-shaped substrate body; a source region situated at a top portion of each of the two prong portions of the tuning fork-shaped substrate body; an epitaxial portion connecting the two prong portions of the tuning fork-shaped substrate body between the out-diffused drain region and the source region; a front gate situated on a first side surface of the tuning fork-shaped substrate body; and a back gate situated on a second side surface opposite to the first side surface of the tuning fork-shaped substrate body.

23 Claims, 4 Drawing Sheets

DUAL VERTICAL CHANNEL TRANSISTOR AND FABRICATION METHOD THEREOF

BACKGROUND OF THE INVENTION

1. Field of the Invention

The present invention relates generally to semiconductor devices. More particularly, this invention relates to a dual vertical channel, dual-gate fin field-effect-transistor (FinFET) with buried bit line scheme, and fabrication method thereof.

2. Description of the Prior Art

A vertical fin field-effect-transistor (FinFET) with embedded or buried bit line scheme has become the mainsteam for next-generation $4F^2$ (F stands for minimum lithographic feature width) cell because of simplified middle-of-line (MOL) process. However, front-end-of-line (FEOL) process becomes more complicated accordingly. For example, shallow trench isolation (STI) with half feature size and an aspect ratio of STI larger than 20 are required for 30 nm generation. Gap fill with oxide film thus becomes an obstacle to dynamic random access memory (DRAM) shrinkage.

Vertical surrounding gate transistors (SGT) with embedded bit lines have been proposed with enlarging isolation rule to greatly reduce difficulty during the STI phase. However, threshold voltage ($V_{th}$) stability for the memory cell array becomes much worse because of complicated fabricating process, including, for example, tedious embedded bit line formation steps, recess for spin-on-dielectric (SOD) formation steps, metal and n+ type poly defined transistor gate length. Reducing $V_{th}$ variation with longer channel length is also unfeasible under vertical dimension constraint.

Further, it has been known that the DRAM array incorporated with the aforesaid vertical FinFET structure with buried bit line scheme face different challenges. For example, parasitic bipolar transistor induced by floating body effect, which causes array Vth instability during cell operation. It has been found that excess majority carriers generated by impact ionization at bit line junction and accumulated in neutral body can reduce transistor threshold voltage. With increasing Ioff, the retention becomes worse.

In light of the above, there is a strong need in this industry to provide a novel FinFET structure and the fabrication process therefore to avoid the aforesaid problems.

SUMMARY OF THE INVENTION

It is therefore the primary object of the invention to provide an improved dual vertical channel, dual-gate fin field-effect-transistor (FinFET) with buried bit line scheme to eliminate the above-mentioned prior art problems or shortcomings.

According to the claimed invention, in one aspect, a dual vertical channel transistor includes a tuning fork-shaped substrate body; a buried bit line embedded at a bottom of a recess between two prong portions of the tuning fork-shaped substrate body; an out-diffused drain region adjacent to the buried bit line in the tuning fork-shaped substrate body; a source region situated at a top portion of each of the two prong portions of the tuning fork-shaped substrate body; an epitaxial portion connecting the two prong portions of the tuning fork-shaped substrate body between the out-diffused drain region and the source region; a front gate situated on a first side surface of the tuning fork-shaped substrate body; and a back gate situated on a second side surface opposite to the first side surface of the tuning fork-shaped substrate body.

According to the claimed invention, in another aspect, a dual vertical channel transistor includes a tuning fork-shaped substrate body of a first conductivity type isolated by a trench isolation region; a buried bit line embedded at a bottom of a recess between two prong portions of the tuning fork-shaped substrate body; an out-diffused drain region of a second conductivity type adjacent to the buried bit line; a source region of the second conductivity type situated at a top portion of each of the two prong portions of the tuning fork-shaped substrate body, wherein the out-diffused drain region and the source region define two vertical channels in the prong portions respectively; an epitaxial portion overlying the buried bit line for communicating the two vertical channels; a localized channel doping region of the first conductivity type adjacent to the epitaxial portion; a front gate situated on a first side surface of the tuning fork-shaped substrate body; and a back gate situated on a second side surface opposite to the first side surface of the tuning fork-shaped substrate body These and other objectives of the present invention will no doubt become obvious to those of ordinary skill in the art after reading the following detailed description of the preferred embodiment that is illustrated in the various figures and drawings.

DETAILED DESCRIPTION

Figure 1:
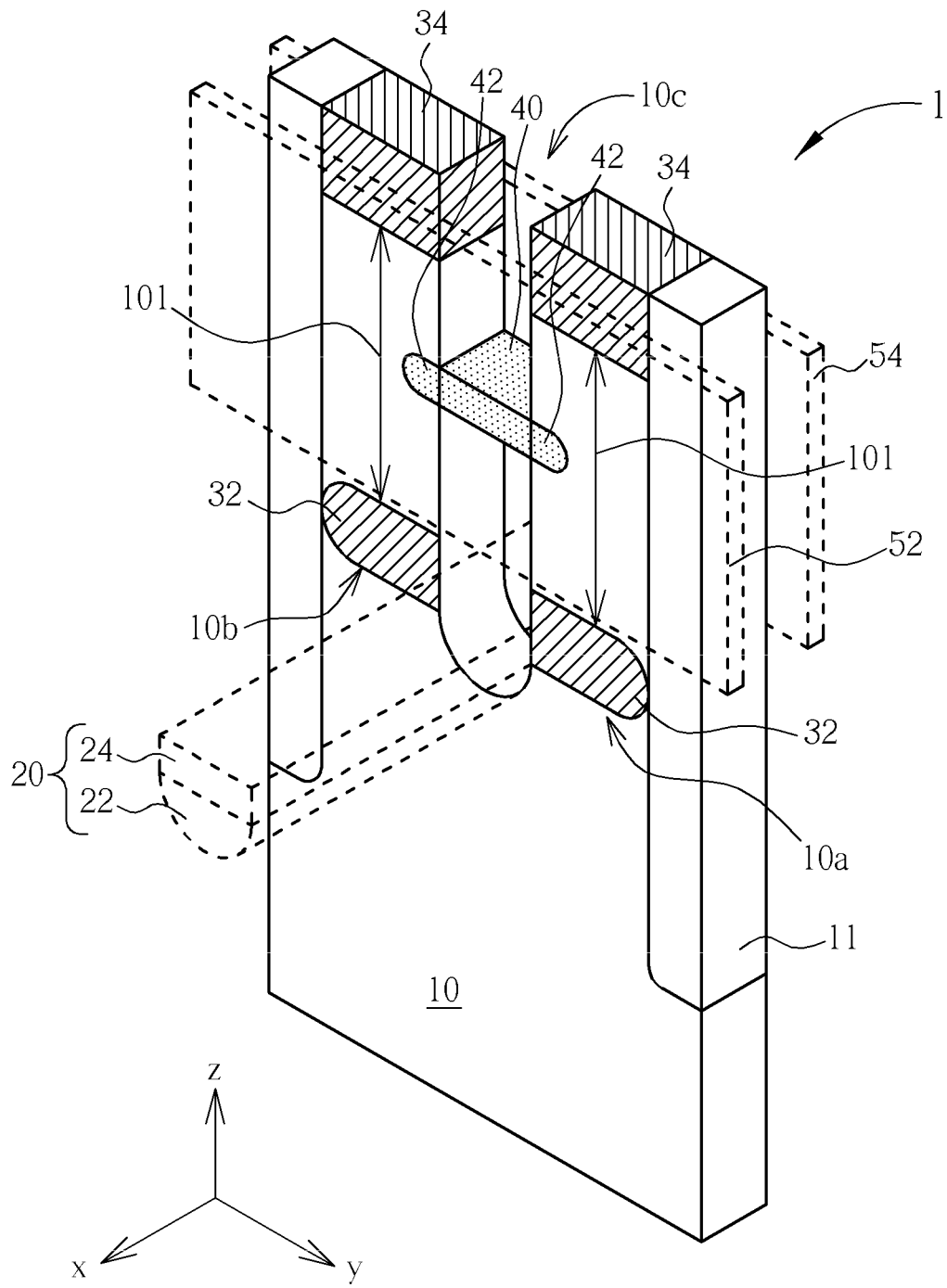
FIG. 1 is a schematic, perspective view of an exemplary dual vertical channel, dual-gate FinFET with buried bit line scheme according to one preferred embodiment of this invention.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail.

Likewise, the drawings showing embodiments of the apparatus are semi-diagrammatic and not to scale and, particularly, some of the dimensions are for the clarity of presentation and are shown exaggerated in the FIGS. Also, where multiple embodiments are disclosed and described having some features in common, for clarity and ease of illustration and description thereof like or similar features one to another will ordinarily be described with like reference numerals.

The preferred embodiment pertains to a dual vertical channel, dual-gate fin field-effect-transistor (FinFET) with buried bit line scheme having a cell area of $4F^2$ or smaller, which is particularly suited for dynamic random access memory (DRAM) applications. The term "horizontal" as used herein is defined as a plane parallel to the conventional major plane or surface of the semiconductor substrate, regardless of its orientation. The term "vertical" refers to a direction that is substantially perpendicular to the horizontal as just defined. Terms, such as "on", "above", "below", "bottom", "top", "side" (as in "sidewall"), "higher", "lower", "over", and "under", are defined with respect to the horizontal plane. It is understood that in some cases, the source and the drain regions may be virtually interchangeable.

FIG. 1 is a schematic, perspective view of an exemplary dual vertical channel, dual-gate FinFET with buried bit line scheme according to one preferred embodiment of this invention. For the sake of clarity, some insulation layers such as gate oxide or trench insulation are omitted in this figure. As shown in FIG. 1, a dual vertical channel, dual-gate transistor 1 comprises a tuning fork-shaped substrate body 10, which may be electrically isolated from an adjacent, duplicate tuning fork-shaped substrate body (not shown in the figures), by a trench isolation region 11. The tuning fork-shaped substrate body 10 may include but not limited to silicon substrate, silicon substrate with an epitaxial layer, a silicon-on-insulator substrate containing a buried insulator layer, gallium arsenide (GaAs) substrate, gallium arsenide-phosphide (GaAsP) substrate, indium phosphide (InP) substrate, gallium aluminum arsenic (GaAlAs) substrate, or indium gallium phosphide (InGaP) substrate. According to the preferred embodiment of this invention, the tuning fork-shaped substrate body 10 is a P type silicon substrate. The tuning fork-shaped substrate body 10 comprises two prong portions 10a and 10b with a recess 10c between the two prong portions 10a and 10b. Each of the two prong portions 10a and 10b constitutes a vertical channel 101 of the dual vertical channel, dual-gate transistor 1.

A buried bit line 20 is embedded at a bottom of the recess 10c between two prong portions 10a and 10b of the tuning fork-shaped substrate body 10. The buried bit line 20 extends along a reference x-axis. According to the preferred embodiment of this invention, the buried bit line 20 comprises two portions: a lower metal portion 22 and an upper polysilicon portion 24. The lower metal portion 22 may include but not limited to tungsten, tungsten nitride, titanium, titanium nitride, tantalum, tantalum nitride, copper, aluminum, silver, or gold. The upper polysilicon portion 24 may be a heavily doped polysilicon layer, for example, $N^+$ doped polysilicon layer.

An out-diffused drain region 32 such as an $N^+$ drain region is disposed adjacent to the buried bit line 20 in each of the two prong portions 10a and 10b of the tuning fork-shaped substrate body 10. More specifically, the out-diffused drain region 32 is in contact with the upper polysilicon portion 24. Dopants of the upper polysilicon portion 24 are driven out to the adjacent prong portions 10a and 10b to form the out-diffused drain region 32. The out-diffused drain region 32 may extend between the upper polysilicon portion 24 and the trench isolation region 11 to thereby form a floating body channel. However, it is to be understood that the out-diffused drain region 32 may not reach the trench isolation region 11, and in this case, a floating body is not formed. A source region 34 such as an $N^+$ source region is situated at a top portion of each of the two prong portions 10a and 10b of the tuning fork-shaped substrate body 10. A vertical channel 101 extending along the reference z-axis is defined between the out-diffused drain region 32 and the source region 34 in each of the two prong portions 10a and 10b.

An epitaxial portion 40, which is analogous to a suspension bridge overlying the buried bit line 20, connects the two prong portions 10a and 10b of the tuning fork-shaped substrate body 10 at an approximately middle position between the out-diffused drain region 32 and the source region 34. According to the preferred embodiment of this invention, the epitaxial portion 40 is an epitaxial silicon portion and is heavily doped by P type impurities. The epitaxial portion 40 communicates the two vertical channels 101 in the two prong portions 10a and 10b and creates a shunt path (or carrier evacuation path) for accumulated carriers such as electron holes generated in either of the two vertical channels 101 during operation of the transistor.

During operation of the transistor 1, stronger impact ionization occurs in one vertical channel and generates excess electron holes, which may be shunted to the other vertical channel through the epitaxial portion 40 to retard body potential change. According to the preferred embodiment of this invention, a P-type localized channel doping region 42 is preferably disposed adjacent to the epitaxial portion 40. Dopants of the epitaxial portion 40 are driven out to the adjacent vertical channels 101 to form the P-type localized channel doping region 42. It is advantageous to use the present invention because the epitaxial portion 40 in combination with the P-type localized channel doping region 42 significantly increase the trigger threshold of parasitic bipolar junction transistor and improve the performance of the transistor 1.

The dual vertical channel, dual-gate transistor 1 further comprises a front gate 52 and a back gate 54. The front gate 52 is situated on a first side surface of the tuning fork-shaped substrate body 10. The back gate 54 is situated on a second side surface opposite to the first side surface of the tuning fork-shaped substrate body 10. Both of the front gate 52 and the back gate 54 extend along a reference y-axis direction that is substantially perpendicular to the buried bit line 20.

Figure 2:
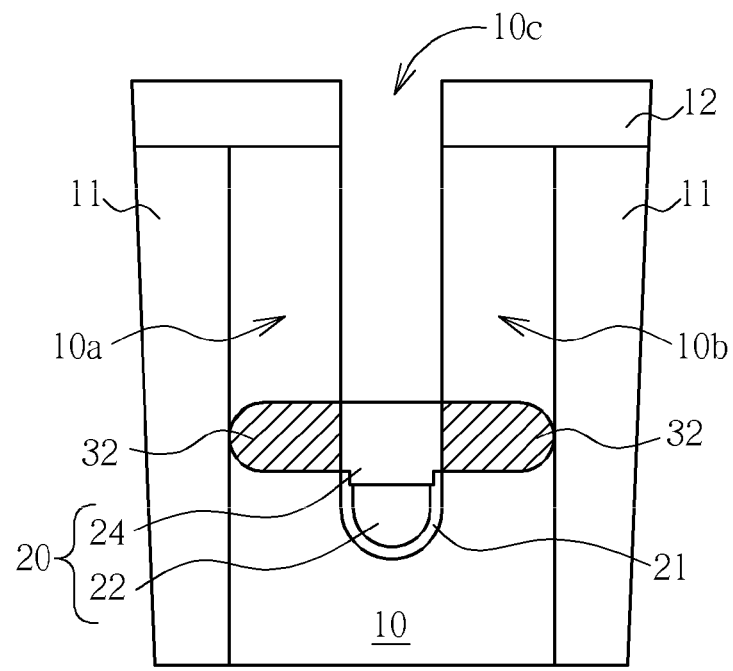
FIGS. 2-7 are schematic, cross-sectional diagrams showing a method for fabricating a dual vertical channel, dual-gate FinFET with buried bit line scheme according to one preferred embodiment of this invention.

FIGS. 2-7 are schematic, cross-sectional diagrams showing a method for fabricating a dual vertical channel, dual-gate FinFET with buried bit line scheme according to one preferred embodiment of this invention. As shown in FIG. 2, a tuning fork-shaped substrate body 10 covered with a pad layer 12 such as a silicon nitride is provided. The tuning fork-shaped substrate body 10 is isolated by a trench isolation region 11, which may be formed by conventional shallow trench isolation (STI) processes. The tuning fork-shaped substrate body 10 may include but not limited to silicon substrate, silicon substrate with an epitaxial layer, a silicon-on-insulator substrate containing a buried insulator layer, gallium arsenide (GaAs) substrate, gallium arsenide-phosphide (GaAsP) substrate, indium phosphide (InP) substrate, gallium aluminum arsenic (GaAlAs) substrate, or indium gallium phosphide (InGaP) substrate. According to the preferred embodiment of this invention, the tuning fork-shaped substrate body 10 is a P type silicon substrate. The tuning fork-shaped substrate body 10 comprises two prong portions 10a and 10b with a recess 10c between the two prong portions 10a and 10b. The recess 10c is aligned with an opening of the pad layer 12.

A buried bit line 20 is provided at a bottom of the recess 10c between two prong portions 10a and 10b of the tuning fork-shaped substrate body 10. According to the preferred embodiment of this invention, the buried bit line 20 may comprise two portions: a lower metal portion 22 and an upper polysilicon portion 24. The lower metal portion 22 may include but not limited to tungsten, tungsten nitride, titanium, titanium nitride, tantalum, tantalum nitride, copper, aluminum, silver, or gold. The upper polysilicon portion 24 may be a heavily doped polysilicon layer, for example, N±doped polysilicon layer. A dielectric layer 21 may be formed at the bottom surface of the recess 10c to isolate the buried bit line 20 from the tuning fork-shaped substrate body 10.

An out-diffused drain region 32 such as an $N^+$ drain region is disposed adjacent to the buried bit line 20 in each of the two prong portions 10a and 10b of the tuning fork-shaped substrate body 10. More specifically, the out-diffused drain region 32 is in contact with the upper polysilicon portion 24. Dopants of the upper polysilicon portion 24 are driven out from upper polysilicon portion 24 to the adjacent prong portions 10a and 10b to thereby form the out-diffused drain region 32. The out-diffused drain region 32 may extend between the upper polysilicon portion 24 and the trench isolation region 11 to thereby form a floating body channel.

Figure 3:
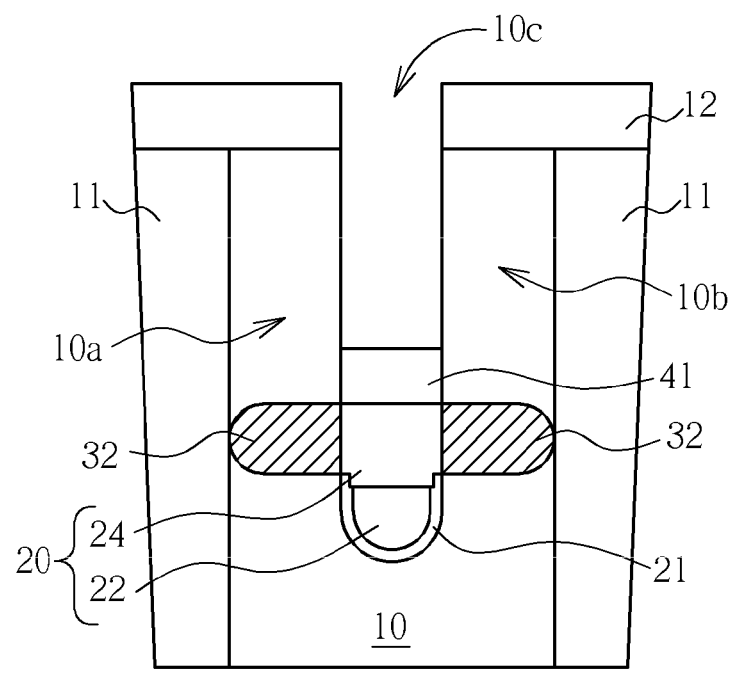

As shown in FIG. 3, subsequently, a first insulation layer 41 such as silicon oxide is formed on the buried bit line 20 within the recess 10c. To form the first insulation layer 41, a silicon oxide may be deposited to fill the recess 10c. The silicon oxide is then etched back to a predetermined depth within the recess 10c.

Figure 4:
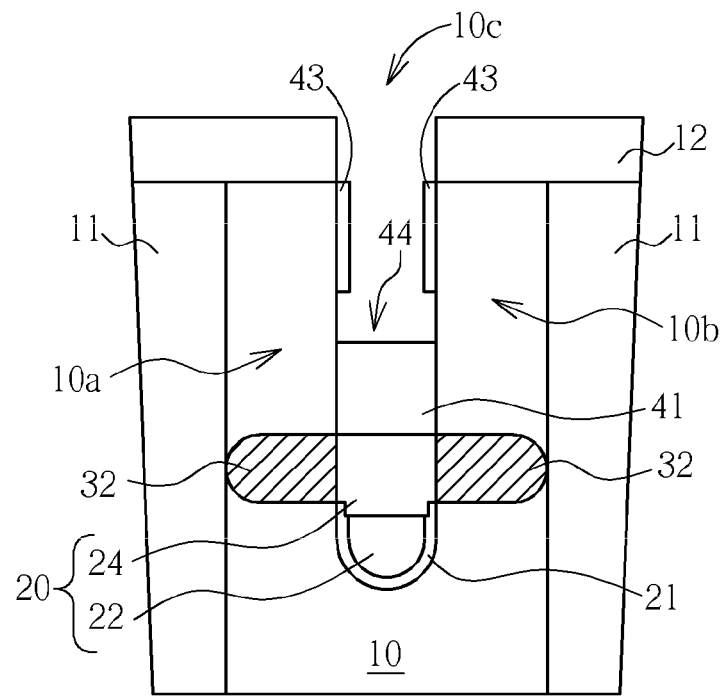

As shown in FIG. 4, after the formation of the first insulation layer 41, a liner 43 such as an oxide layer is formed to cover an upper sidewall of the recess 10c above the first insulation layer 41. As indicated by numeral number 44, a portion of the substrate 10 between the liner 43 and the first insulation layer 41 is exposed to form a window 44. To form the liner 43, a sacrificial layer (not shown) is formed on the first insulation layer 41 and etched back to a predetermined depth. A thermal oxidation process may be carried out to oxidize the sidewall of the recess 10c above the sacrificial layer. Thereafter, the sacrificial layer is removed. It is to be understood that other methods may be used to form the liner 43.

Figure 5:
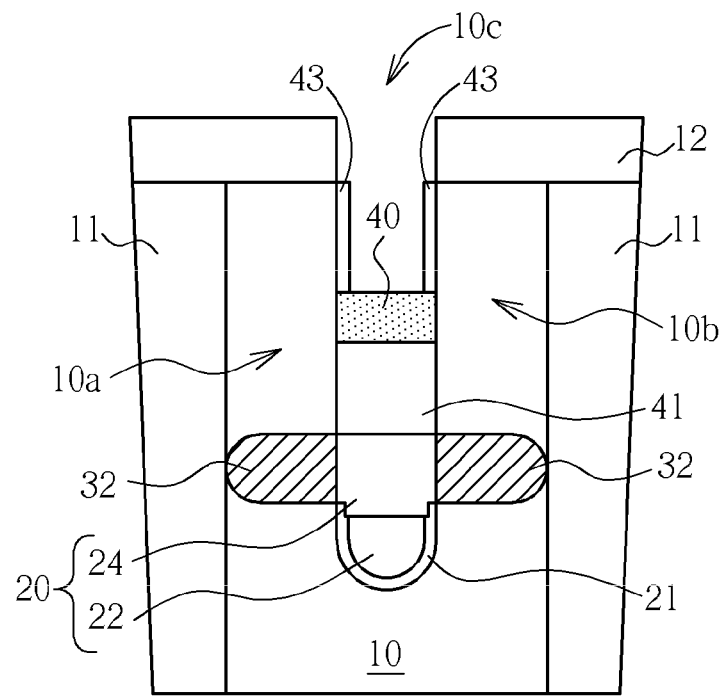

As shown in FIG. 5, after the formation of the liner 43, a silicon epitaxy growth process is carried out to laterally grow silicon epitaxial portion 40 from the window 44. The silicon epitaxial portion 40 connects the two prong portions 10a and 10b of the tuning fork-shaped substrate body 10 at an approximately middle position between the out-diffused drain region 32 and a top surface of the tuning fork-shaped substrate body 10.

Figure 6:
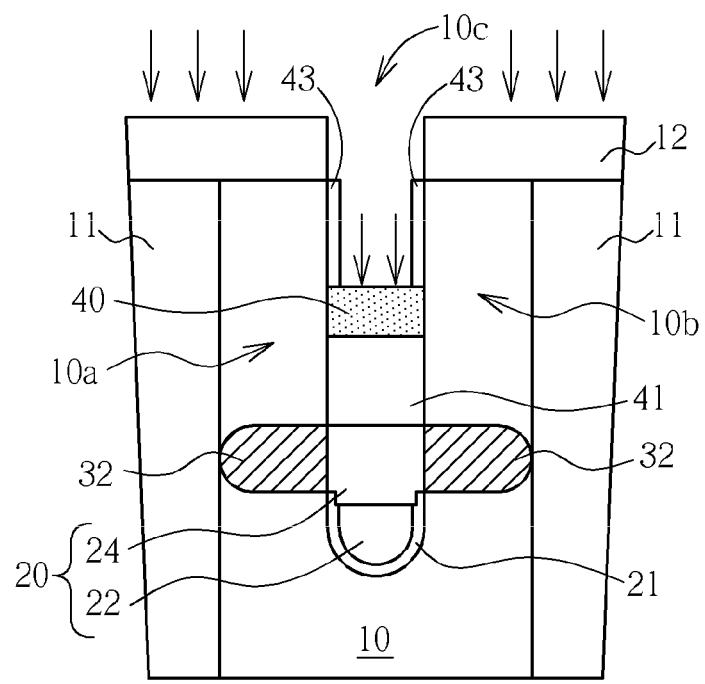

As shown in FIG. 6, after the formation of the silicon epitaxial portion 40, a P type impurity doping process is performed to heavily implant P type dopants such as boron into the silicon epitaxial portion 40.

Figure 7:
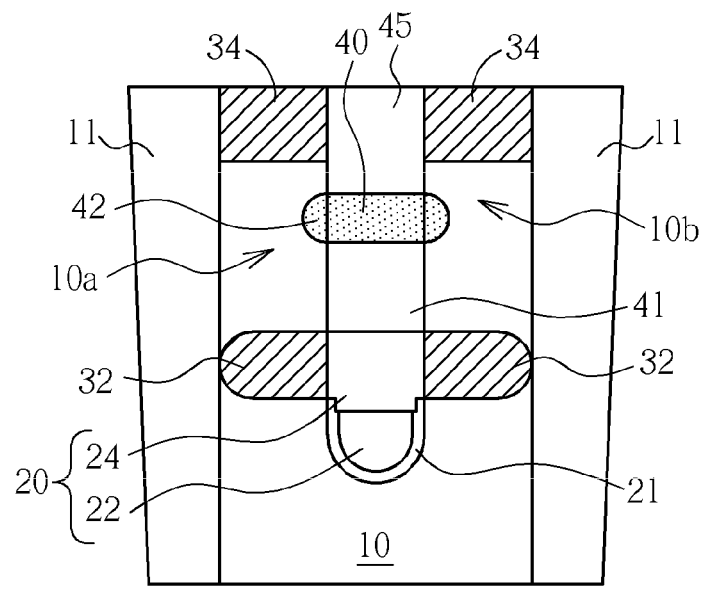

As shown in FIG. 7, a second insulation layer 45 such as silicon oxide is deposited to fill the recess 10c and is disposed overlying the silicon epitaxial portion 40. To form the second insulation layer 45, the pad layer 12 may be removed, a chemical vapor deposition (CVD) process may be carried out to deposit silicon oxide into the recess 10c, and then a chemical mechanical polishing (CMP) process may be performed to remove excess silicon oxide. As a result, the second insulation layer 45 is substantial flush with a top surface of the tuning fork-shaped substrate body 10. Subsequently, another impurity doping process is performed to heavily implant N type dopants into the tuning fork-shaped substrate body 10 to thereby form the source regions 34. A thermal process may be carried out to form the P-type localized channel doping region 42. The epitaxial portion 40 and the P-type localized channel doping region 42 may be disposed at an approximately middle position between the out-diffused drain region 32 and the source region 34. In one aspect, the P-type localized channel doping region 42 is kept a predetermined distance from both of the out-diffused drain region 32 and the source region 34. The P-type localized channel doping region 42 does not overlap with a junction of the out-diffused drain region 32 and does not overlap with a junction of the source region 34.

Those skilled in the art will readily observe that numerous modifications and alterations of the device and method may be made while retaining the teachings of the invention.

What is claimed is:

1. A dual vertical channel transistor comprising:
a tuning fork-shaped substrate body;
a buried bit line embedded at a bottom of a recess between two prong portions of said tuning fork-shaped substrate body;
a first source/drain region adjacent to said buried bit line in said tuning fork-shaped substrate body;
a second source/drain region situated at a top portion of each of said two prong portions of said tuning fork-shaped substrate body;
an epitaxial portion connecting said two prong portions of said tuning fork-shaped substrate body, said epitaxial portion being situated between said first source/drain region and said second source/drain region;
a front gate situated on a first side surface of said tuning fork-shaped substrate body; and
a back gate spaced apart from the front gate and situated on a second side surface opposite to said first side surface of said tuning fork-shaped substrate body, wherein the tuning fork-shaped substrate body is interposed between the front gate and the back gate.

2. The dual vertical channel transistor according to claim 1 wherein a first insulation layer is disposed between said epitaxial portion and said buried bit line.

3. The dual vertical channel transistor according to claim 1 wherein said epitaxial portion is disposed at an approximately middle position between said first source/drain region and said second source/drain region.

4. The dual vertical channel transistor according to claim 1 wherein a second insulation layer is disposed overlying said epitaxial portion.

5. The dual vertical channel transistor according to claim 4 wherein said second insulation layer is substantial flush with a top surface of said tuning fork-shaped substrate body.

6. The dual vertical channel transistor according to claim 5 wherein said second insulation layer fills up said recess.

7. The dual vertical channel transistor according to claim 1 wherein said epitaxial portion is an epitaxial silicon portion.

8. The dual vertical channel transistor according to claim 7 wherein said epitaxial portion is heavily doped by P type impurities.

9. The dual vertical channel transistor according to claim 1 wherein said buried bit line comprises two portions: a lower metal portion and an upper polysilicon portion.

10. The dual vertical channel transistor according to claim 9 wherein said out-diffused drain region is in contact with said upper polysilicon portion.

11. The dual vertical channel transistor according to claim 1 wherein said buried bit line extends along a first direction and both of said front gate and said back gate extend along a second direction that is substantially perpendicular to said first direction.

12. The dual vertical channel transistor according to claim 1 wherein said epitaxial portion bridges two vertical channels and constitutes a shunt path for accumulated hole generated in either of said two vertical channels.

13. A dual vertical channel transistor comprising:
a tuning fork-shaped substrate body of a first conductivity type isolated by a trench isolation region;
a buried bit line embedded at a bottom of a recess between two prong portions of said tuning fork-shaped substrate body;
an out-diffused drain region of a second conductivity type adjacent to said buried bit line;
a source region of said second conductivity type situated at a top portion of each of said two prong portions of said tuning fork-shaped substrate body, wherein said out-diffused drain region and said source region define two vertical channels in said prong portions respectively;
an epitaxial portion overlying said buried bit line for communicating said two vertical channels;
a localized channel doping region of said first conductivity type adjacent to said epitaxial portion;
a front gate situated on a first side surface of said tuning fork-shaped substrate body; and
a back gate spaced apart from the front gate and situated on a second side surface opposite to said first side surface of said tuning fork-shaped substrate body, wherein the tuning fork-shaped substrate body is interposed between the front gate and the back gate.

14. The dual vertical channel transistor according to claim 13 wherein said localized channel doping region is kept a distance from both of the out-diffused drain region and the source region.

15. The dual vertical channel transistor according to claim 13 wherein said localized channel doping region is an out diffused doping region from said epitaxial portion.

16. The dual vertical channel transistor according to claim 13 wherein said localized channel doping region is situated between said out-diffused drain region and said source region.

17. The dual vertical channel transistor according to claim 13 wherein said first conductivity type is P type and said second conductivity type is N type.

18. The dual vertical channel transistor according to claim 13 wherein said epitaxial portion is an epitaxial silicon portion.

19. The dual vertical channel transistor according to claim 18 wherein said epitaxial portion is heavily doped by P type impurities.

20. The dual vertical channel transistor according to claim 13 wherein said buried bit line comprises two portions: a lower metal portion and an upper polysilicon portion.

21. The dual vertical channel transistor according to claim 20 wherein said out-diffused drain region is in contact with said upper polysilicon portion.

22. The dual vertical channel transistor according to claim 13 wherein said buried bit line extends along a first direction and both of said front gate and said back gate extend along a second direction that is substantially perpendicular to said first direction.

23. The dual vertical channel transistor according to claim 13 wherein said epitaxial portion and said localized channel doping region constitute a shunt path for accumulated hole generated in either of said two vertical channels.

* * * * *